(12) United States Patent
Zhou et al.

(10) Patent No.: US 9,330,934 B2
(45) Date of Patent: May 3, 2016

(54) METHODS OF FORMING PATTERNS ON SUBSTRATES

(75) Inventors: Baosuo Zhou, Boise, ID (US); Alex J. Schrinsky, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/467,687

(22) Filed: May 18, 2009

(65) Prior Publication Data
US 2010/0291771 A1  Nov. 18, 2010

(51) Int. Cl.
*H01L 21/033* (2006.01)
*H01L 21/311* (2006.01)
*H01L 21/3213* (2006.01)
*H01L 27/115* (2006.01)

(52) U.S. Cl.
CPC ...... *H01L 21/31138* (2013.01); *H01L 21/0337* (2013.01); *H01L 21/0338* (2013.01); *H01L 21/31116* (2013.01); *H01L 21/31122* (2013.01); *H01L 21/31144* (2013.01); *H01L 21/32139* (2013.01); *H01L 27/11526* (2013.01); *H01L 27/11534* (2013.01)

(58) Field of Classification Search
USPC ....................................................... 438/696
See application file for complete search history.

(56) References Cited

U.S. PATENT DOCUMENTS

| 4,910,168 A | 3/1990 | Tsai |
| 5,008,207 A | 4/1991 | Blouse et al. |
| 5,013,680 A | 5/1991 | Lowrey et al. |
| 5,047,117 A | 9/1991 | Roberts |
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |
| 5,593,813 A | 1/1997 | Kim |
| 5,616,510 A | 4/1997 | Wong |
| 5,905,279 A | 5/1999 | Nitayama et al. |

(Continued)

FOREIGN PATENT DOCUMENTS

| CN | 1550889 | 12/2004 |
| CN | 1752844 | 3/2006 |

(Continued)

OTHER PUBLICATIONS

U.S. Appl. No. 12/328,435, filed Dec. 4, 2008, Sills et al.

(Continued)

*Primary Examiner* — Shamim Ahmed
*Assistant Examiner* — Bradford Gates
(74) *Attorney, Agent, or Firm* — Wells St. John P.S.

(57) ABSTRACT

Methods of forming a pattern on a substrate include forming carbon-comprising material over a base material, and spaced first features over the carbon-comprising material. Etching is conducted only partially into the carbon-comprising material and spaced second features are formed within the carbon-comprising material which comprise the partially etched carbon-comprising material. Spacers can be formed along sidewalls of the spaced second features. The carbon-comprising material can be etched through to the base material using the spacers as a mask. Spaced third features can be formed which comprise the anisotropically etched spacers and the carbon-comprising material.

47 Claims, 14 Drawing Sheets

(56) References Cited

U.S. PATENT DOCUMENTS

| | | | |
|---|---|---|---|
| 5,916,821 A | 6/1999 | Kerber | |
| 6,063,688 A | 5/2000 | Doyle et al. | |
| 6,087,263 A | 7/2000 | Clampitt et al. | |
| 6,140,217 A | 10/2000 | Jones et al. | |
| 6,174,818 B1 * | 1/2001 | Tao et al. | 438/733 |
| 6,207,490 B1 | 3/2001 | Lee | |
| 6,235,574 B1 | 5/2001 | Tobben et al. | |
| 6,249,335 B1 | 6/2001 | Hirukawa et al. | |
| 6,303,272 B1 | 10/2001 | Furukawa et al. | |
| 6,352,932 B1 * | 3/2002 | Clampitt et al. | 438/700 |
| 6,383,952 B1 | 5/2002 | Subramanian et al. | |
| 6,429,123 B1 | 8/2002 | Tseng | |
| 6,483,136 B1 | 11/2002 | Makoto et al. | |
| 6,545,904 B2 | 4/2003 | Tran | |
| 6,548,385 B1 | 4/2003 | Lai | |
| 6,548,401 B1 | 4/2003 | Trivedi | |
| 6,566,280 B1 | 5/2003 | Meagley et al. | |
| 6,580,136 B2 | 6/2003 | Mandelman et al. | |
| 6,599,844 B2 | 7/2003 | Koh et al. | |
| 6,605,541 B1 | 8/2003 | Yu | |
| 6,627,524 B2 | 9/2003 | Scott | |
| 6,630,379 B2 | 10/2003 | Mandelman et al. | |
| 6,638,441 B2 | 10/2003 | Chang et al. | |
| 6,649,956 B2 | 11/2003 | Yoshida et al. | |
| 6,667,502 B1 | 12/2003 | Agarwal et al. | |
| 6,703,323 B2 | 3/2004 | Kong et al. | |
| 6,710,390 B2 | 3/2004 | Parekh et al. | |
| 6,734,107 B2 | 5/2004 | Lai et al. | |
| 6,735,132 B2 | 5/2004 | Siek | |
| 6,753,220 B2 | 6/2004 | Jeungling | |
| 6,756,619 B2 | 6/2004 | Tran | |
| 6,774,051 B2 | 8/2004 | Chung et al. | |
| 6,811,817 B2 | 11/2004 | Sugeta et al. | |
| 6,826,069 B2 | 11/2004 | Kurjanowicz et al. | |
| 6,864,184 B1 | 3/2005 | Gabriel | |
| 6,872,512 B2 | 3/2005 | Yamashita | |
| 6,893,972 B2 | 5/2005 | Rottstegge et al. | |
| 6,905,975 B2 | 6/2005 | Boettinger et al. | |
| 6,916,594 B2 | 7/2005 | Bok et al. | |
| 6,951,822 B2 | 10/2005 | Scholz | |
| 6,977,404 B2 | 12/2005 | Katsumata et al. | |
| 7,023,069 B2 | 4/2006 | Blanchard | |
| 7,037,840 B2 | 5/2006 | Katz | |
| 7,042,038 B2 | 5/2006 | Makoto et al. | |
| 7,049,652 B2 * | 5/2006 | Mokhlesi et al. | 257/315 |
| 7,064,376 B2 | 6/2006 | Shau | |
| 7,067,385 B2 | 6/2006 | Manning | |
| 7,074,533 B2 | 7/2006 | Fuller et al. | |
| 7,098,105 B2 | 8/2006 | Juengling | |
| 7,115,525 B2 | 10/2006 | Abatchev et al. | |
| 7,125,781 B2 | 10/2006 | Manning et al. | |
| 7,151,040 B2 | 12/2006 | Tran et al. | |
| 7,166,533 B2 | 1/2007 | Happ | |
| 7,199,005 B2 | 4/2007 | Sandhu et al. | |
| 7,202,127 B2 | 4/2007 | Musch et al. | |
| 7,202,174 B1 | 4/2007 | Jung et al. | |
| 7,230,292 B2 | 6/2007 | Graettinger | |
| 7,253,118 B2 | 8/2007 | Tran et al. | |
| 7,265,059 B2 | 9/2007 | Rao et al. | |
| 7,271,108 B2 | 9/2007 | Sadjadi | |
| 7,314,810 B2 | 1/2008 | Jung et al. | |
| 7,320,911 B2 | 1/2008 | Basceri et al. | |
| 7,339,252 B2 | 3/2008 | Blanchard | |
| 7,361,609 B2 | 4/2008 | Hah et al. | |
| 7,384,849 B2 | 6/2008 | Parekh et al. | |
| 7,387,939 B2 | 6/2008 | Manning | |
| 7,390,749 B2 | 6/2008 | Kim et al. | |
| 7,390,750 B1 | 6/2008 | Ramkumar et al. | |
| 7,396,781 B2 | 7/2008 | Wells | |
| 7,439,152 B2 | 10/2008 | Manning | |
| 7,442,976 B2 | 10/2008 | Juengling | |
| 7,517,753 B2 | 4/2009 | Manning | |
| 7,521,371 B2 | 4/2009 | DeBruler | |
| 7,521,378 B2 | 4/2009 | Fucsko et al. | |
| 7,524,607 B2 | 4/2009 | Ho et al. | |
| 7,537,866 B2 | 5/2009 | King Liu | |
| 7,544,563 B2 | 6/2009 | Manning | |
| 7,553,760 B2 | 6/2009 | Yang et al. | |
| 7,557,013 B2 | 7/2009 | Bhat et al. | |
| 7,557,015 B2 | 7/2009 | Sandhu et al. | |
| 7,582,412 B2 | 9/2009 | Cameron et al. | |
| 7,682,924 B2 | 3/2010 | Bhat et al. | |
| 7,687,387 B2 | 3/2010 | Inaba et al. | |
| 7,696,076 B2 | 4/2010 | Jung et al. | |
| 7,713,818 B2 | 5/2010 | Chan | |
| 7,754,591 B2 | 7/2010 | Jung | |
| 7,790,357 B2 | 9/2010 | Jung | |
| 7,790,360 B2 | 9/2010 | Alapati et al. | |
| 7,807,575 B2 | 10/2010 | Zhou | |
| 7,842,601 B2 | 11/2010 | Lee et al. | |
| 7,846,646 B2 | 12/2010 | Akifumi | |
| 7,851,135 B2 | 12/2010 | Jung et al. | |
| 7,855,038 B2 | 12/2010 | Hah et al. | |
| 7,897,460 B2 | 3/2011 | Parekh et al. | |
| 7,923,371 B2 | 4/2011 | Shinohe | |
| 7,959,818 B2 | 6/2011 | Jung | |
| 8,067,286 B2 | 11/2011 | Parekh et al. | |
| 8,083,953 B2 | 12/2011 | Millward et al. | |
| 8,083,958 B2 | 12/2011 | Li et al. | |
| 8,148,052 B2 | 4/2012 | Vanleenhove et al. | |
| 8,247,302 B2 | 8/2012 | Sills et al. | |
| 8,273,634 B2 | 9/2012 | Sills et al. | |
| 8,338,304 B2 | 12/2012 | Zhou | |
| 8,440,576 B2 | 5/2013 | Hong | |
| 8,575,032 B2 | 11/2013 | Light et al. | |
| 8,629,048 B1 | 1/2014 | Sipani et al. | |
| 8,629,527 B2 | 1/2014 | Parekh et al. | |
| 8,796,155 B2 | 8/2014 | Sills | |
| 2002/0037617 A1 | 3/2002 | Kim et al. | |
| 2002/0043690 A1 | 4/2002 | Doyle et al. | |
| 2002/0094688 A1 | 7/2002 | Mitsuiki | |
| 2002/0130343 A1 | 9/2002 | Tran | |
| 2003/0001214 A1 | 1/2003 | Makoto et al. | |
| 2003/0006410 A1 | 1/2003 | Doyle | |
| 2003/0008968 A1 | 1/2003 | Sugeta et al. | |
| 2003/0091936 A1 | 5/2003 | Rottstegge et al. | |
| 2003/0096903 A1 | 5/2003 | Sugeta et al. | |
| 2004/0043546 A1 | 3/2004 | Makoto et al. | |
| 2004/0198065 A1 | 10/2004 | Lee et al. | |
| 2004/0253535 A1 | 12/2004 | Cameron et al. | |
| 2005/0058950 A1 | 3/2005 | Sugeta et al. | |
| 2005/0130068 A1 | 6/2005 | Kondoh et al. | |
| 2005/0142497 A1 | 6/2005 | Ryou et al. | |
| 2005/0164478 A1 | 7/2005 | Chan et al. | |
| 2005/0173740 A1 | 8/2005 | Jim | |
| 2005/0214683 A1 | 9/2005 | Eiichi et al. | |
| 2005/0215040 A1 | 9/2005 | Doyle | |
| 2005/0255696 A1 | 11/2005 | Makiyama et al. | |
| 2005/0272220 A1 | 12/2005 | Waldfried et al. | |
| 2006/0011947 A1 | 1/2006 | Juengling | |
| 2006/0024621 A1 | 2/2006 | Nolscher et al. | |
| 2006/0046200 A1 | 3/2006 | Abatchev et al. | |
| 2006/0046422 A1 | 3/2006 | Tran et al. | |
| 2006/0046484 A1 | 3/2006 | Abatchev et al. | |
| 2006/0063384 A1 | 3/2006 | Hah et al. | |
| 2006/0088788 A1 | 4/2006 | Kudo et al. | |
| 2006/0099347 A1 | 5/2006 | Sugeta et al. | |
| 2006/0115978 A1 | 6/2006 | Specht et al. | |
| 2006/0118785 A1 | 6/2006 | Allen et al. | |
| 2006/0154182 A1 | 7/2006 | Brodsky | |
| 2006/0240361 A1 | 10/2006 | Lee et al. | |
| 2006/0262511 A1 | 11/2006 | Abatchev et al. | |
| 2006/0263699 A1 | 11/2006 | Abatchev et al. | |
| 2006/0273456 A1 | 12/2006 | Sant et al. | |
| 2006/0278911 A1 | 12/2006 | Eppich | |
| 2006/0281266 A1 | 12/2006 | Wells | |
| 2006/0288795 A1 | 12/2006 | Eppich et al. | |
| 2007/0003878 A1 | 1/2007 | Paxton et al. | |
| 2007/0010058 A1 | 1/2007 | Juengling | |
| 2007/0020565 A1 | 1/2007 | Koh et al. | |
| 2007/0023805 A1 | 2/2007 | Wells et al. | |
| 2007/0026684 A1 | 2/2007 | Parascandola et al. | |
| 2007/0037066 A1 | 2/2007 | Hsiao | |
| 2007/0045712 A1 | 3/2007 | Haller et al. | |

(56) References Cited

U.S. PATENT DOCUMENTS

| | | |
|---|---|---|
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Makoto et al. |
| 2007/0049040 A1* | 3/2007 | Bai et al. ............... 438/712 |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshnell et al. |
| 2007/0148984 A1* | 6/2007 | Abatchev et al. ......... 438/725 |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1* | 10/2007 | Niroomand et al. ......... 438/700 |
| 2007/0248916 A1 | 10/2007 | Kamijima |
| 2007/0261016 A1 | 11/2007 | Sandhu et al. |
| 2007/0264828 A1 | 11/2007 | Jung |
| 2007/0264830 A1 | 11/2007 | Huang et al. |
| 2007/0278183 A1 | 12/2007 | Lee et al. |
| 2007/0281219 A1* | 12/2007 | Sandhu ............... B82Y 10/00 430/5 |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1* | 3/2008 | Fischer et al. ............ 430/314 |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0193658 A1 | 8/2008 | Millward |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0011374 A1 | 1/2009 | Chang et al. |
| 2009/0074958 A1 | 3/2009 | Xiao |
| 2009/0108415 A1 | 4/2009 | Lenski et al. |
| 2009/0117739 A1* | 5/2009 | Shin et al. ............... 438/690 |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1 | 8/2009 | Cheng et al. |
| 2009/0214823 A1 | 8/2009 | Cheng et al. |
| 2009/0291397 A1 | 11/2009 | DeVilliers |
| 2009/0298274 A1 | 12/2009 | Kajiwara |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Eiichi et al. |
| 2010/0068656 A1 | 3/2010 | Yeh et al. |
| 2010/0081265 A1 | 4/2010 | Mashita et al. |
| 2010/0093175 A1 | 4/2010 | Niroomand et al. |
| 2010/0124826 A1 | 5/2010 | Millward et al. |
| 2010/0129980 A1 | 5/2010 | Sandhu et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |
| 2011/0147984 A1 | 6/2011 | Cheng et al. |
| 2013/0009283 A1 | 1/2013 | Zhou |
| 2013/0078574 A1 | 3/2013 | Peeters et al. |

FOREIGN PATENT DOCUMENTS

| | | |
|---|---|---|
| CN | 1761063 | 4/2006 |
| CN | 101026087 | 8/2007 |
| CN | 101145515 | 3/2008 |
| EP | 0171111 | 2/1986 |
| EP | 1273974 A2 | 1/2003 |
| JP | 56046531 | 4/1981 |
| JP | 58157135 | 9/1983 |
| JP | 59211231 | 11/1984 |
| JP | 64035916 | 7/1989 |
| JP | 1292829 | 11/1989 |
| JP | 3270227 | 12/1991 |
| JP | 06-077180 | 3/1994 |
| JP | 6275577 | 9/1994 |
| JP | 2002-217170 | 8/2002 |
| JP | 2003234279 | 8/2003 |
| JP | 2004134574 | 4/2004 |
| JP | 2004247399 | 9/2004 |
| JP | 2006245625 | 9/2006 |
| JP | 2007017993 | 1/2007 |
| JP | 2008-072101 | 3/2008 |
| KR | 20030056601 | 7/2003 |
| KR | 20030089063 | 11/2003 |
| KR | 10-2004-0016678 | 2/2004 |
| KR | 4025289 | 3/2004 |
| KR | 20030049198 | 6/2004 |
| KR | 20040057582 | 7/2004 |
| KR | 10-2007-0076793 | 7/2007 |
| KR | 10-2007-0122049 | 12/2007 |
| KR | 10-0784062 B1 | 12/2007 |
| KR | 10-2008-0039006 | 5/2008 |
| KR | 20080038963 | 5/2008 |
| TW | 200702903 | 1/2007 |
| TW | 200818405 | 4/2008 |
| TW | 200834660 | 8/2008 |
| WO | WO 2006/104654 | 10/2006 |
| WO | WO2007/027558 | 3/2007 |
| WO | WO 2008/008338 | 1/2008 |
| WO | WO PCT/US2007/025729 | 1/2009 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/063978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |
| WO | WO PCT/US2010/055488 | 6/2012 |

(56) References Cited

FOREIGN PATENT DOCUMENTS

OTHER PUBLICATIONS

U.S. Appl. No. 12/328,448, filed Dec. 4, 2008, Sills et al.
U.S. Appl. No. 12/328,464, filed Dec. 4, 2008, Sills et al.
U.S. Appl. No. 11/714,378, filed Mar. 5, 2007; Preliminary Amendment; 13 pps.
PCT/US2009/039793; Search Report mailed Oct. 30, 2009; 4 pp.
PCT/US2009/039793; Written Opinion mailed Oct. 30, 2009; 5 pp.
PCT/US2009/041500; Search Report mailed Dec. 7, 2009; 3 pp.
PCT/US2009/041500; Written Opinion mailed Dec. 7, 2009; 3 pp.
PCT/US2007/015729; Search Report mailed Jan. 2, 2008; 3 pp.
PCT/US2007/015729; Written Opinion mailed Jan. 2, 2008; 7 pp.
Innovative Solutions to Enhance the Legacy Equipments Towards "One Generation ahead" in Flip chip BGA 0.8mm Ball Pitch Technology; Sep. 2005; EE et al.; 4 pp.
Enhanced Resolution for Future Fabrication; Jan. 2003; Fritze et al.; 5 pp.
A Flexible Gate Array Architecture for High-speed and High-Density Applications; Mar. 1996 Gallia et al.; 430-436.
Sub-40nm Half-Pitch Double Patterning with Resist Freezing Process; 2008; Hori et al.; 8 pp.
Double-Patterning Technique Using Plasma Treatment of Photoresist; Sep. 20, 2007; Lee et al.; 5 pp.
Softbake and Post-exposure Bake Optimization for Process Window Improvement and Optical Proximity Effect Tuning; 2006; Liau et al.; 7 pp.
Advanced cell Structures for Dynamic RAMs; Jan. 1989; Lu; pp. 27-36.
Plasma Resist Image Stabilization Technique (PRIST); 1980; Ma; 2 pp.
Immersion Lithography Ready for 45nm Manufacturing and Beyond; 2007; Owa et al.; pp. 238-244.
Lithography and Other Patterning Techniques for Future Electronics; Feb. 2008; Pease et al.; pp. 248-270.
Current Status of Nanonex Nanoimprint Solutions; 2004; Tan et al.; 9 pp.
Newly developed RELACS process and materials for 65 nm node device and beyond; Feb. 2006; Terai et al.; pp. 20-21.
Polysilazane SODs Spinful 400 Series for STI/PMD Application; Clariant; At least as early as Oct. 19, 2009; 1 pp.
U.S. Appl. No. 13/101,485, filed May 5, 2011, Light et al.
TW 098113229 Search Report, Sep. 26, 2012, Micron Technology, Inc.
CN 200980148548.8 SR, Feb. 18, 2013, Micron Technology, Inc.
EP 09830819 Sup. Search Report, Mar. 21, 2013, Micron Technology, Inc.
CN200980148590.X Search Report, Feb. 22, 2013, Micron Technology, Inc.
CN 200980148546.9 SR, Nov. 23, 2012, Micron Technology, Inc.
TW 098139941 SR, Dec. 18, 2012, Micron Technology, Inc.
TW 098139943 SR, Dec. 21, 2012, Micron Technology, Inc.
EP 09830818.2 Supplemental SR, Jul. 30, 2013, Micron Technology, Inc.
EP 09830820 Supp. Search Rep. Aug. 13, 2013, Micron Technology, Inc.
SG 201300853-7 Search Report, Jun. 10, 2013, Micron Technology, Inc.
SG 201300853-7 Written Opinion, Jun. 11, 2013, Micron Technology, Inc.
TW 099140232 SR Translation, Jul. 29, 2013, Micron Technology, Inc.
CN 201080013110.1 Search Rep., May 9, 2013, Micron Technology, Inc.
EP 09743197 Supp. Partial SR, Jun. 18, 2013, Micron Technology, Inc.
EP 10756541 Supp. Search. Rep., May 27, 2013, Micron Technology, Inc.
TW 098139942 SR Translation, Dec. 27, 2013, Micron Technology, Inc.
0.1µm Level Contact Hole Pattern Formation with KrF Lithography by Resolution Enhancement Lithography Assistedby Chemical Shrink (RELACS); Toyoshima et al.; IEEE; 1998; pp. 12.5.1-12.5.4.

\* cited by examiner

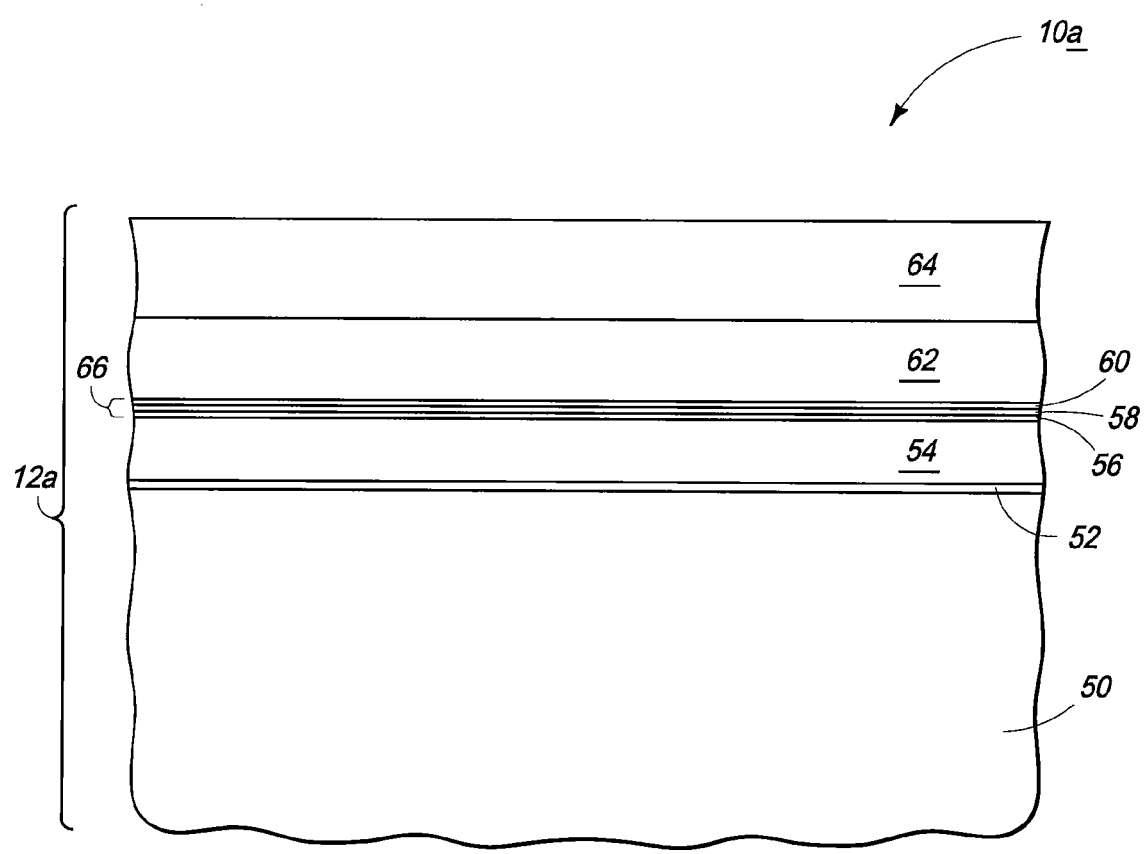

METHODS OF FORMING PATTERNS ON SUBSTRATES

TECHNICAL FIELD

Embodiments disclosed herein pertain to methods of forming patterns on substrates.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized.

The continual reduction in feature sizes places ever greater demands on the techniques used to form the features. For example, photolithography is commonly used to form patterned features, such as conductive lines. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch multiplication, such as pitch doubling, is one proposed method for extending the capabilities of photolithographic techniques beyond their minimum pitch. Such typically forms features narrower than minimum photolithography resolution by depositing spacer-forming layers to have a lateral thickness which is less than that of the minimum capable photolithographic feature size. The spacer-forming layers are commonly anisotropically etched to form sub-lithographic features, and then the features which were formed at the minimum photolithographic feature size are etched from the substrate. Using such technique where pitch is actually halved, such reduction in pitch is conventionally referred to as pitch "doubling". More generally, "pitch multiplication" encompasses increase in pitch of two or more times and also of fractional values other than integers. Thus, conventionally, "multiplication" of pitch by a certain factor actually involves reducing the pitch by that factor.

Transistor gates are one general type of integrated circuit device component that may be used in many different types of integrated circuitry, for example in memory circuitry such as flash. A flash memory is a type of EEPROM (electrically-erasable programmable read-only memory) that may be erased and reprogrammed in blocks. Many modern personal computers have BIOS stored on a flash memory chip. Such BIOS is sometimes called flash BIOS. Flash memory is also popular in wireless electronic devices as it enables manufacturers to support new communication protocols as they become standardized, and provides the ability to remotely upgrade the devices for enhanced features.

A typical flash memory comprises a memory array that includes a large number of memory cells arranged in row and column fashion. The cells are usually grouped into blocks. Each of the cells within a block may be electrically programmed by charging a floating gate. The charge may be removed from the floating gate by a block erase operation. Data is stored in a cell as charge in the floating gate.

NAND is a basic architecture of flash memory. A NAND cell unit comprises at least one select gate coupled in series to a serial combination of memory cells (with the serial combination being commonly referred to as a NAND string).

Flash memory incorporates charge storage structures into transistor gates, and incorporates control gate structures over the charge storage structures. The charge storage structures may be immediately over gate dielectric. The charge storage structures comprise material capable of storing/trapping charge and which is collectively referred to herein as floating gate material. The amount of charge stored in the charge storage structures determines a programming state. In contrast, standard field effect transistors (FETs) do not utilize charge storage structures as part of the transistors, but instead have a conductive gate directly over gate dielectric material.

BRIEF DESCRIPTION OF THE DRAWINGS

FIG. 13 is a schematic of a NAND memory array in accordance with an embodiment.

FIG. 14 is a diagrammatic sectional view of a substrate in process in accordance with an embodiment of the invention.

DETAILED DESCRIPTION OF EXAMPLE EMBODIMENTS

Figure 1:
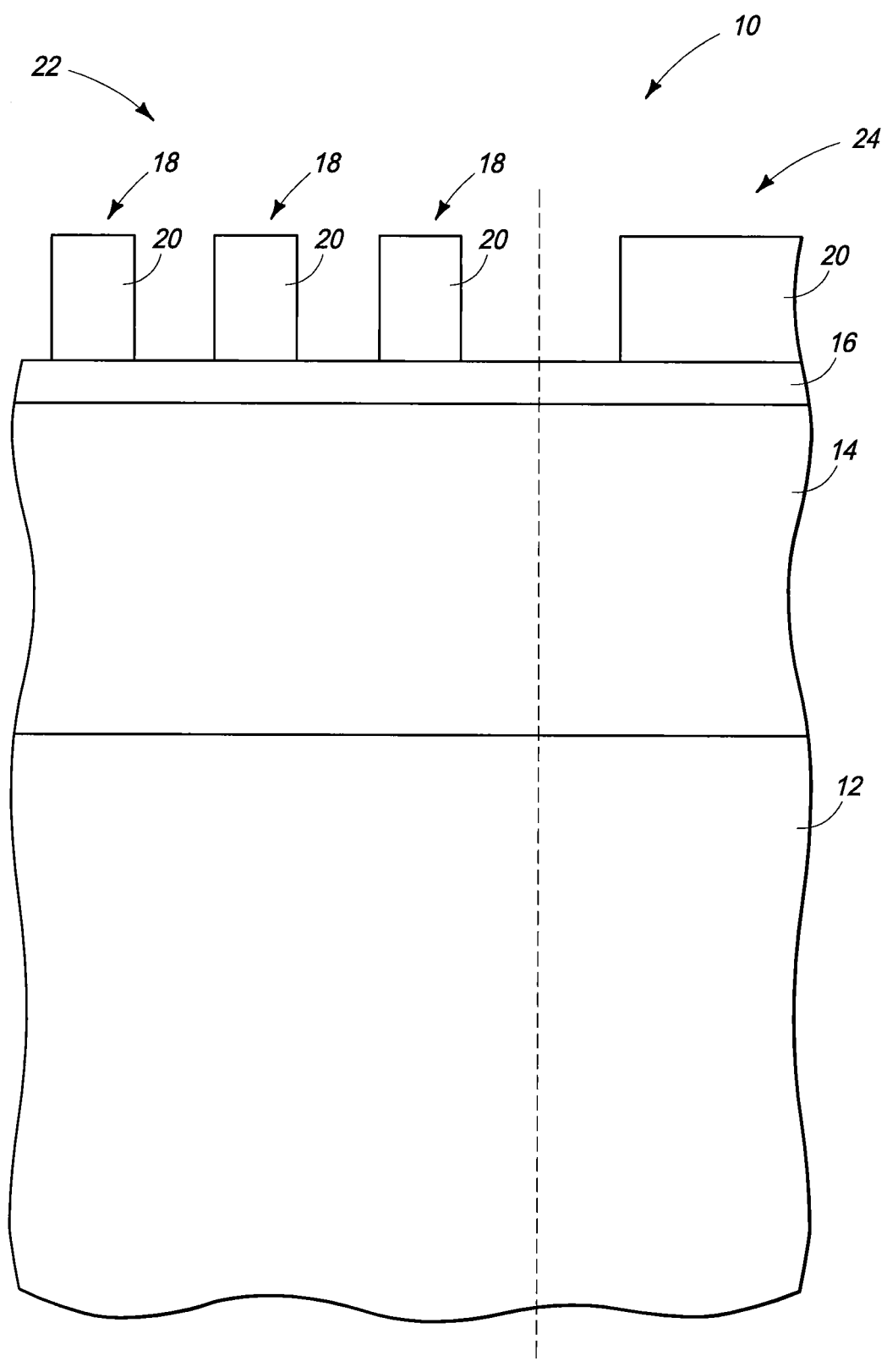
FIG. 1 is a diagrammatic sectional view of a substrate in process in accordance with an embodiment of the invention.

Example embodiments of methods of forming a pattern on a substrate are initially described with reference to FIGS. 1-11 with respect to a substrate 10. Such may comprise a semiconductor substrate or other substrate, and in some embodiments be used in the fabrication of integrated circuitry. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 comprises a base substrate or material 12, a carbon-comprising material 14 over base material 12, a hardmask material 16 over carbon-comprising material 14, and a masking material 20 over hardmask material 16. Base material 12 may be homogenous or non-homogenous, and may comprise different composition layers. Such may comprise any one or combination of semiconductive material, insulative material, and conductive material.

Carbon-comprising material 14 may be homogenous or non-homogenous. Examples include amorphous carbon, transparent carbon, and carbon-containing polymers. Example carbon-containing polymers include spin-on-carbons (SOCs). Carbon-comprising material 14 may consist essentially of any one or more of these example materials. An example thickness range for carbon-comprising material 14 is from about 700 Angstroms to about 2,000 Angstroms.

Hardmask material 16 may be homogenous or non-homogenous, and may comprise multiple different composition layers. In one embodiment, hardmask material 16 comprises an antireflective coating, for example a coating comprising $Si_xO_yN_z$. Regardless, in one embodiment, hardmask material 16 is inorganic. Hardmask material may also comprise a bottom antireflective coating (BARC), for example between a $Si_xO_yN_z$-comprising material and masking material 20. An example thickness range for hardmask material 16 is from 200 Angstroms to 400 Angstroms. Hardmask material 16 is not required in all embodiments.

Masking material 20 may be homogenous or non-homogenous, and may comprise multiple different composition layers. One example material is photoresist. FIG. 1 depicts masking material 20 as having been patterned to form spaced primary features 18 over hardmask material 16. Such are depicted as being equal in size and shape relative one another and equally spaced relative to each immediately adjacent feature 18, although alternate configurations are of course contemplated. In one embodiment in the fabrication of integrated circuitry, substrate 10 may be considered as comprising an array circuitry area 22 and a peripheral circuitry area 24, wherein features 18 are at least provided within array circuitry area 22. The same or other features might additionally be provided in peripheral circuitry area 24. Periphery circuitry area 24, by way of example only, is shown as being largely masked by material 20 in the FIG. 1 configuration. Primary features 18 may or may not be fabricated above, at, or below the minimum photolithographic feature size with which the substrate will ultimately be processed where photolithographic processing is used. Further, primary features 18 may be treated or coated after initial formation.

Figure 2:
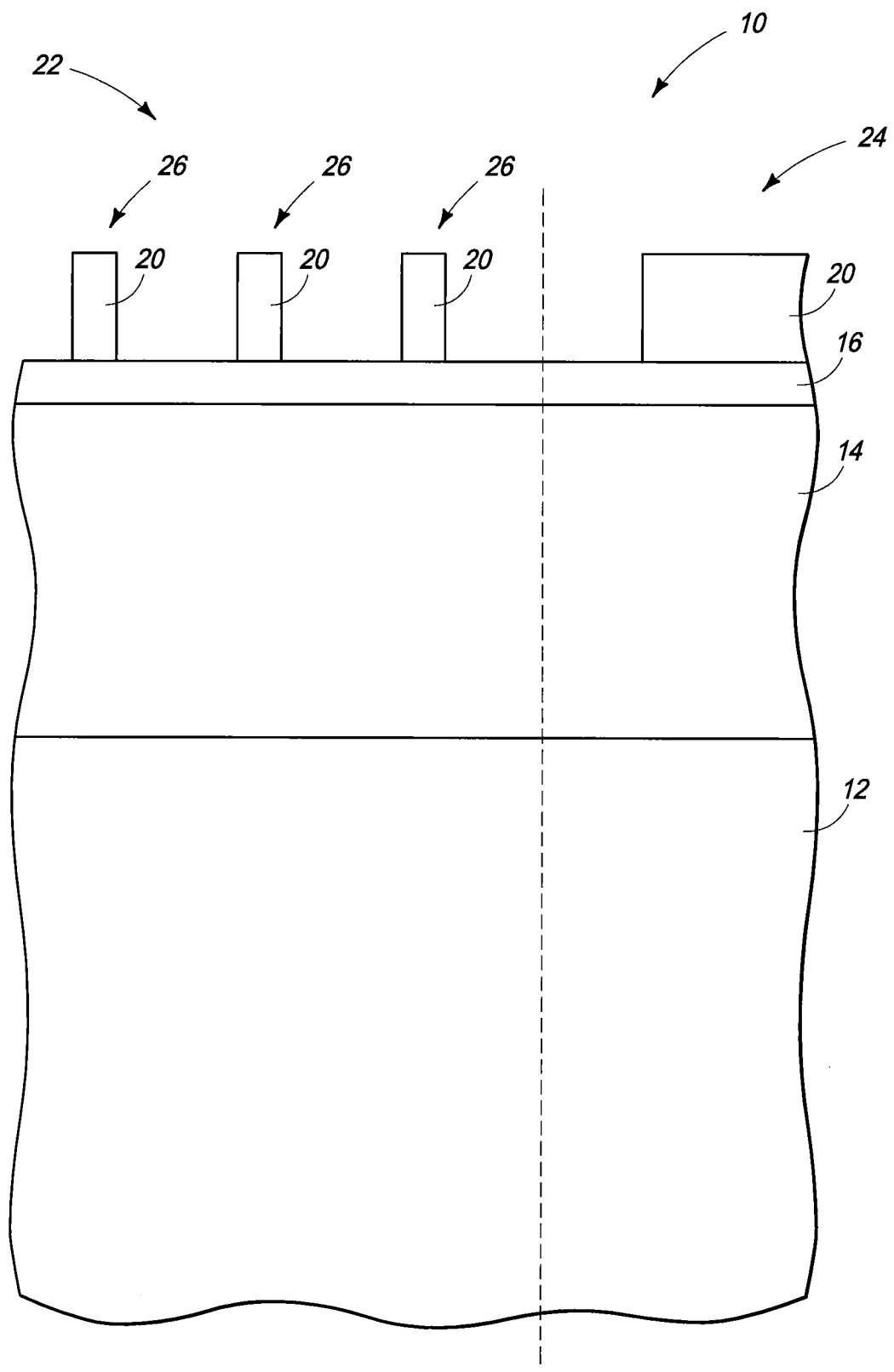
FIG. 2 is a view of the FIG. 1 substrate at a processing step subsequent to that shown by FIG. 1.

Referring to FIG. 2, primary features 18 of FIG. 1 have been processed to laterally trim their respective widths, thereby forming spaced first features 26 within array circuitry area 22. Masking material 20 in periphery area 24 is also shown as being laterally trimmed. Such may be conducted by an isotropic etch which removes material approximately equally from the sides and top of spaced primary features 18 of FIG. 1, as is shown. Alternately, chemistries and conditions may be used which tend to etch greater material from the lateral sides of spaced primary features 18 than from the respective tops. Alternately, chemistries and conditions may be used which tend to etch greater material from the tops of spaced mask features 18 than from the lateral sides.

For example, the construction depicted by FIG. 2 may be derived by plasma etching the substrate of FIG. 1 within an inductively coupled reactor. Example etching parameters which will achieve essentially isotropic etching where material of spaced mask features 18 is photoresist and/or other organic-comprising material are pressure from about 2 mTorr to about 50 mTorr, substrate temperature from about 0° C. to about 100° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where material of spaced primary features 18 comprises a photoresist, such will isotropically etch mask features 18 at a rate from about 0.2 nanometers per second to about 3 nanometers per second. While such an example etch is essentially isotropic, greater lateral etching of the spaced mask features will occur as two sides are laterally exposed as compared to only a single top surface thereof.

If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm.

It may be desired that the stated etching provide greater removal from the top of the spaced mask features than from the sides, for example to either achieve equal elevation and width reduction or more elevation than width reduction. The example parameters for achieving greater etch rate in the vertical direction as opposed to the lateral direction includes pressure from about 2 mTorr to about 20 mTorr, temperature from about 0° C. to about 100° C., source power from about 150 watts to about 300 watts, bias voltage at greater than or equal to about 200 volts, $Cl_2$ and/or HBr flow from about 200 sccm to about 100 sccm, and $O_2$ flow from about 10 sccm to about 20 sccm.

FIGS. 1 and 2 depict but one example of forming spaced first features 26 which will be used as an etch mask in example embodiments described below. Any other existing or yet-to-be developed techniques might be used to form spaced first features, and whether or not such are sub-lithographic. Regardless, the spaced first features may or may not be in direct physical touching contact with carbon-comprising material 14. FIG. 2 shows one embodiment wherein spaced first features 26 are spaced from carbon-comprising material 14 by hardmasking material 16. Regardless, in one embodiment, the spaced first features and the carbon-comprising material are of different compositions.

Figure 3:
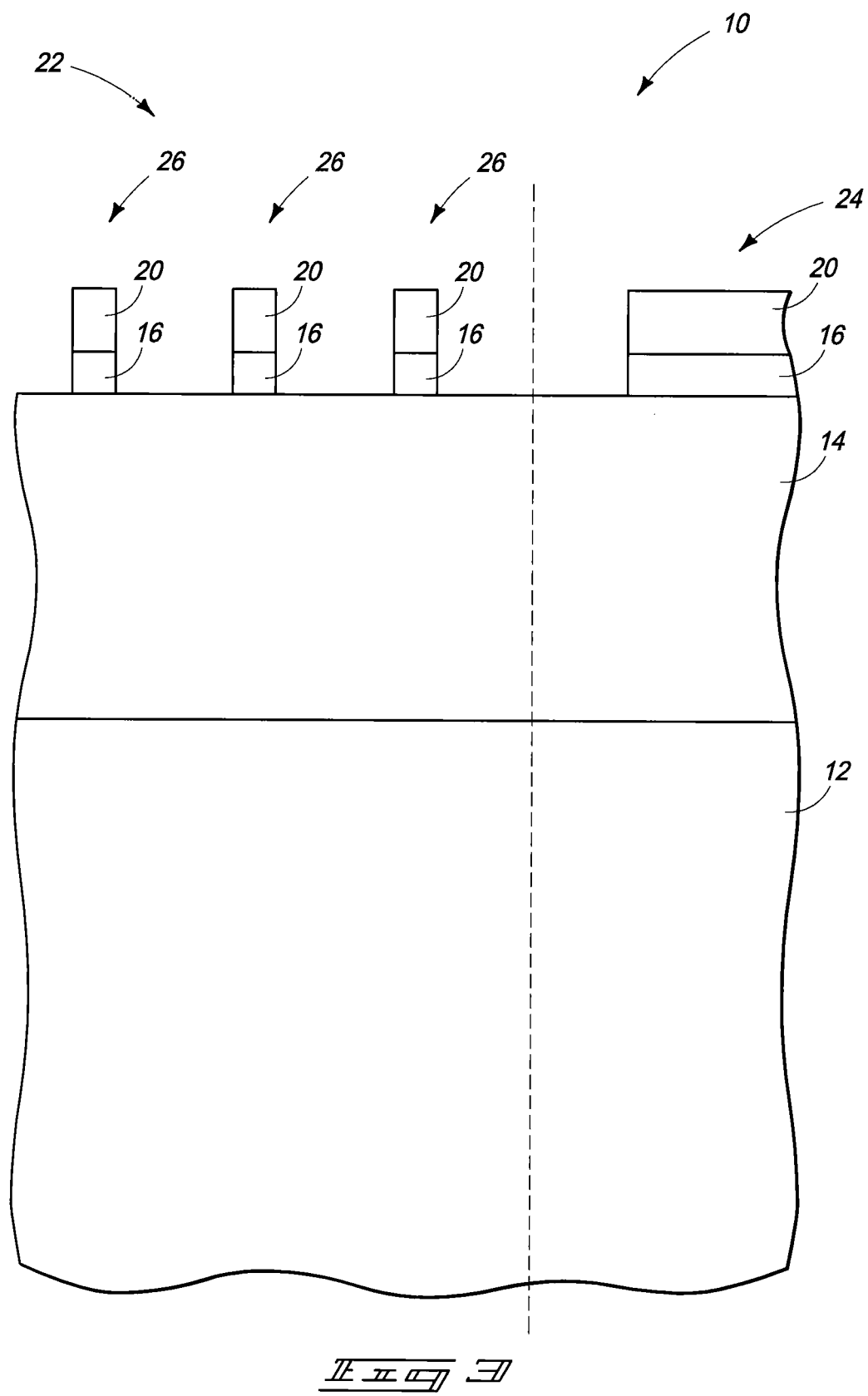
FIG. 3 is a view of the FIG. 2 substrate at a processing step subsequent to that shown by FIG. 2.

Referring to FIG. 3, first etching has been conducted through hardmask material 16 using spaced first features 26 as a mask. In the FIG. 3 example, such etching has been conducted selectively (rate 2:1 or greater) relative to carbon-comprising material 14, although such is not required. For example, the act of etching through hardmask material 16 may also etch into carbon-comprising material 14. Further and regardless, some, none, or all of masking material 20 might be etched during the etching of hardmask material 16. FIG. 3 depicts some etching having been conducted of masking material 20, and wherein at least some of the thickness of masking material 20 remains after completion of the etching through masking material 16. Where hardmask material 16 comprises $Si_xO_yN_z$, example etching chemistries include any of HBr, $CF_4$, or other fluorocarbon chemistries. If all of material 20 were removed in the FIG. 3 etch (not shown), material 16 may be considered as spaced first features.

References are made herein to acts of first etching, second etching, and third etching. Such references to first, second, and third are defined as only being temporally related to each other, and do not preclude other etching having been conducted to the stated material or other material before such acts of etching. For example, etching of such material or other material may or may not occur before and/or after the stated etching. Further, additional etching of one or more stated materials might occur between the stated first, second, and third etchings.

Figure 4:
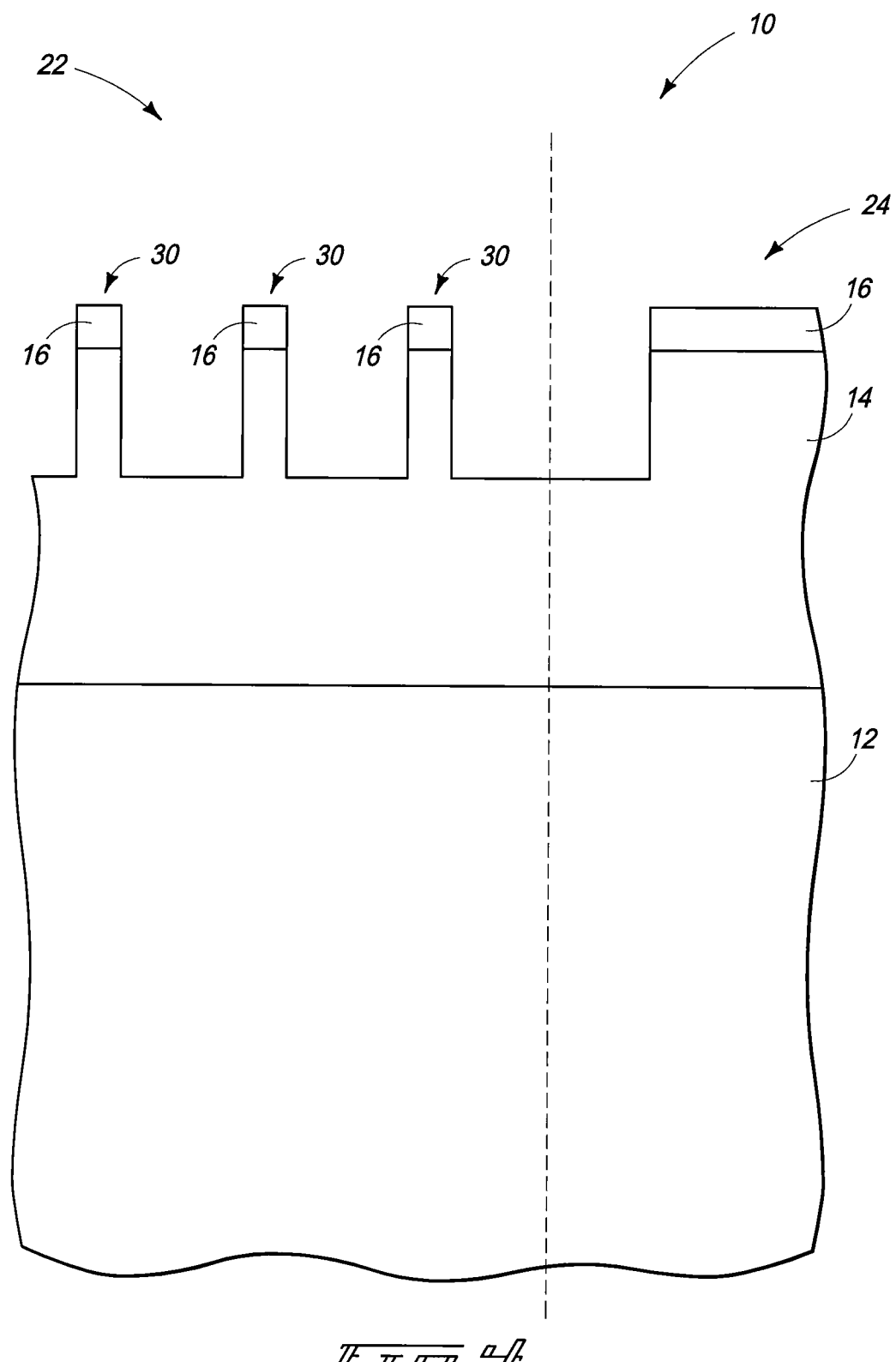
FIG. 4 is a view of the FIG. 3 substrate at a processing step subsequent to that shown by FIG. 3.

Referring to FIG. 4, etching has been conducted only partially into carbon-comprising material 14. Such partial etching may be into less than one half, one half, or more than one half of thickness of carbon-comprising material 14. Such may be determined or controlled by time of etch. FIG. 4 depicts an example wherein the partial etching has been into less than one half of thickness of carbon-comprising material 14. Regardless, in one example wherein carbon-comprising material 14 has a thickness of from about 700 Angstroms to about 2,000 Angstroms, such partial etching into carbon-comprising material 14 is into from about 300 Angstroms to about 1,500 Angstroms of material 14. Where carbon-comprising material 14 is amorphous carbon or transparent carbon, an example anisotropic etching chemistry comprises a combination of $O_2$ and $SO_2$. Example parameters for such etching include a pressure from about 1 mTorr to about 30 mTorr, source power from about 200 Watts to about 1,500 Watts, bias voltage from about 50 volts to about 500 volts, substrate temperature at from about 10° C. to about 70° C., and combined $SO_2$ and $O_2$ flow from about 20 sccm to about 500 sccm. An alternate example chemistry includes a combination of $O_2$, $N_2$, and HBr. Example parameters for such etching include a pressure from about 1 mTorr to about 30 mTorr, source power from about 200 Watts to about 1,500 Watts, bias voltage from about 50 volts to about 500 volts, substrate temperature at from about 10° C. to about 70° C., $O_2$ flow from about 10 sccm to about 300 sccm, $N_2$ flow from about 10 sccm to about 500 sccm, and HBr flow from about 10 sccm to about 300 sccm.

FIG. 4 depicts an embodiment wherein the partial etching has formed spaced second features 30 within carbon-comprising material 14 which comprise partially etched carbon-comprising material 14 and hardmask material 16. As stated above, some or all of spaced first features 26 of FIG. 2 may or may not remain at the conclusion of the example FIG. 3 etching. Further, spaced second features 30 may or may not comprise material of spaced first features 26. Regardless, the spaced first features may or may not be completely removed from the substrate at some point. In one embodiment where such are completely removed from the substrate, such act of removing might be completed during the act of etching only partially into carbon-comprising material 14. In FIG. 4, all remnant of spaced first features 26 from FIG. 2 have been etched completely away from the substrate at or prior to completion of the partial etching into carbon-comprising material 14.

Figure 5:
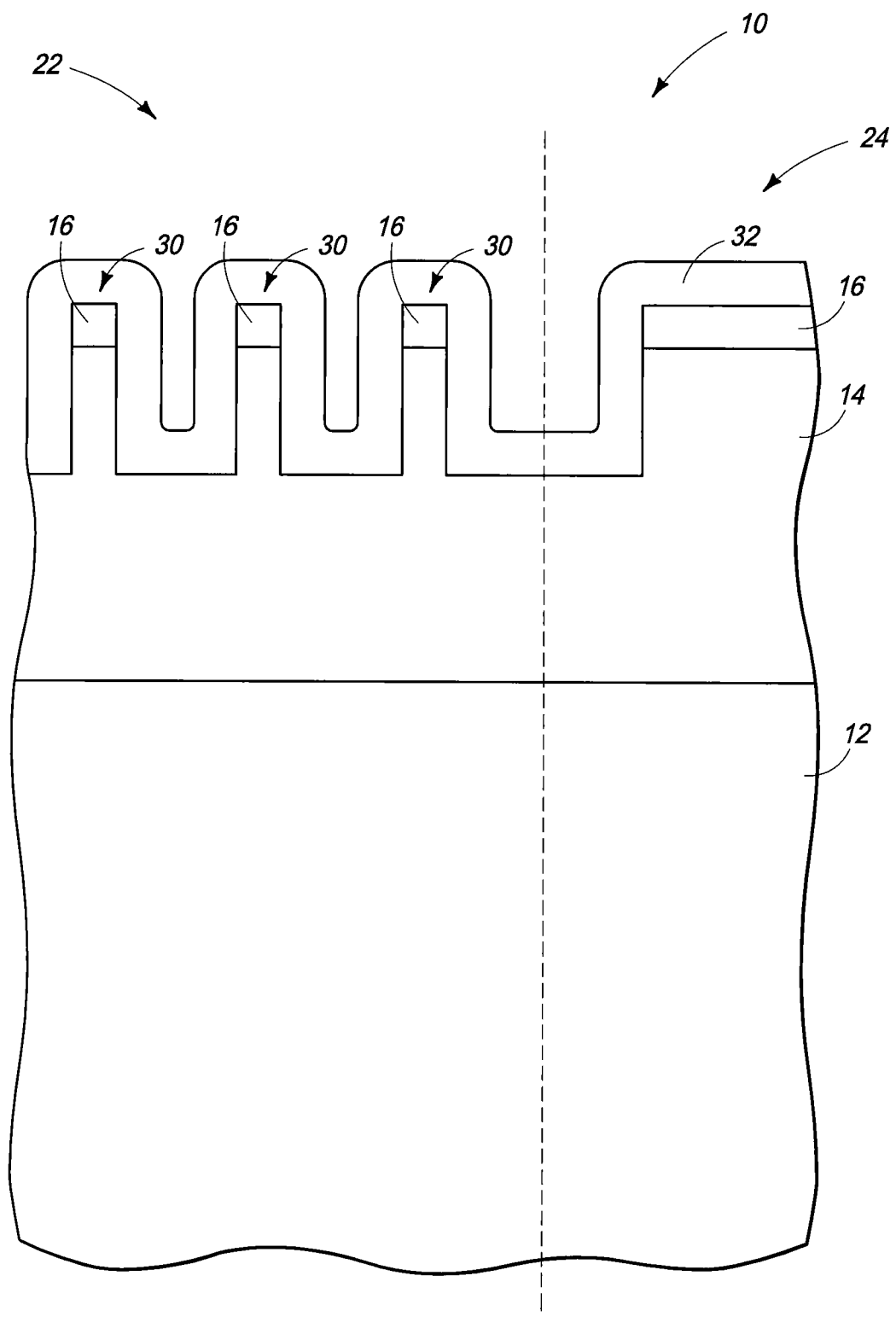
FIG. 5 is a view of the FIG. 4 substrate at a processing step subsequent to that shown by FIG. 4.

Referring to FIG. 5, a spacer-forming layer 32 has been deposited over/as part of substrate 10. Such may be homogenous or non-homogenous, and may comprise a material different in composition from that of carbon-comprising material 14. Example materials include silicon, silicon-dioxide, and/or silicon nitride. Thickness of spacer-forming layer 32 may be largely determinative of feature width dimensions as will be apparent from the continuing discussion.

Figure 6:
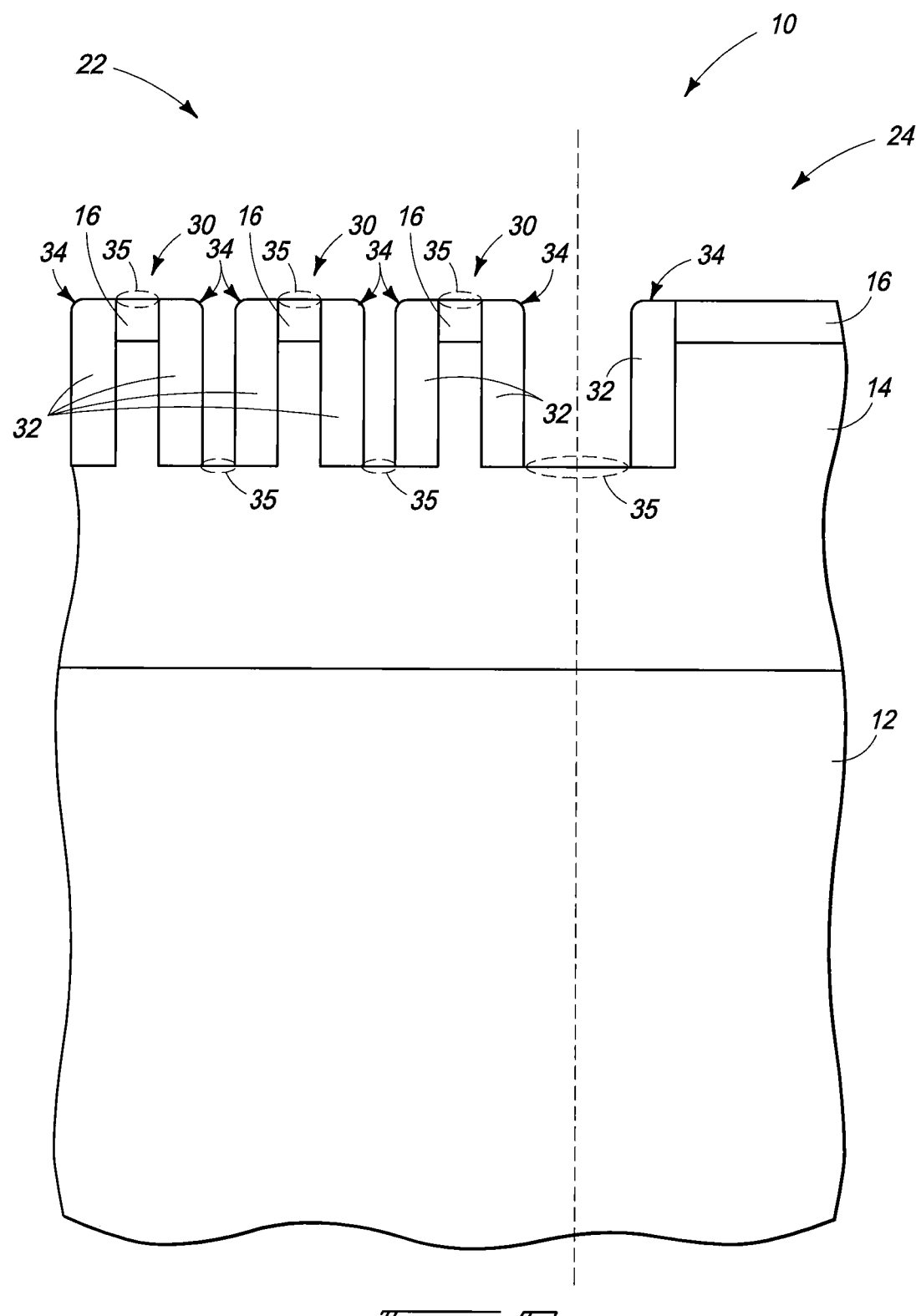
FIG. 6 is a view of the FIG. 5 substrate at a processing step subsequent to that shown by FIG. 5.

Referring to FIG. 6, spacer-forming layer 32 has been anisotropically etched to form spacers 34 along sidewalls of spaced second features 30. In one embodiment and as shown, anisotropically etched spacers 34 are formed in direct physical touching contact with carbon of carbon-comprising material 14. In one embodiment and as shown, formation of anisotropically etched spacers 34 leaves alternating outwardly exposed regions 35 of carbon-comprising material 14 and hardmask material 16 between immediately adjacent of anisotropically etched spacers 34.

Figure 7:
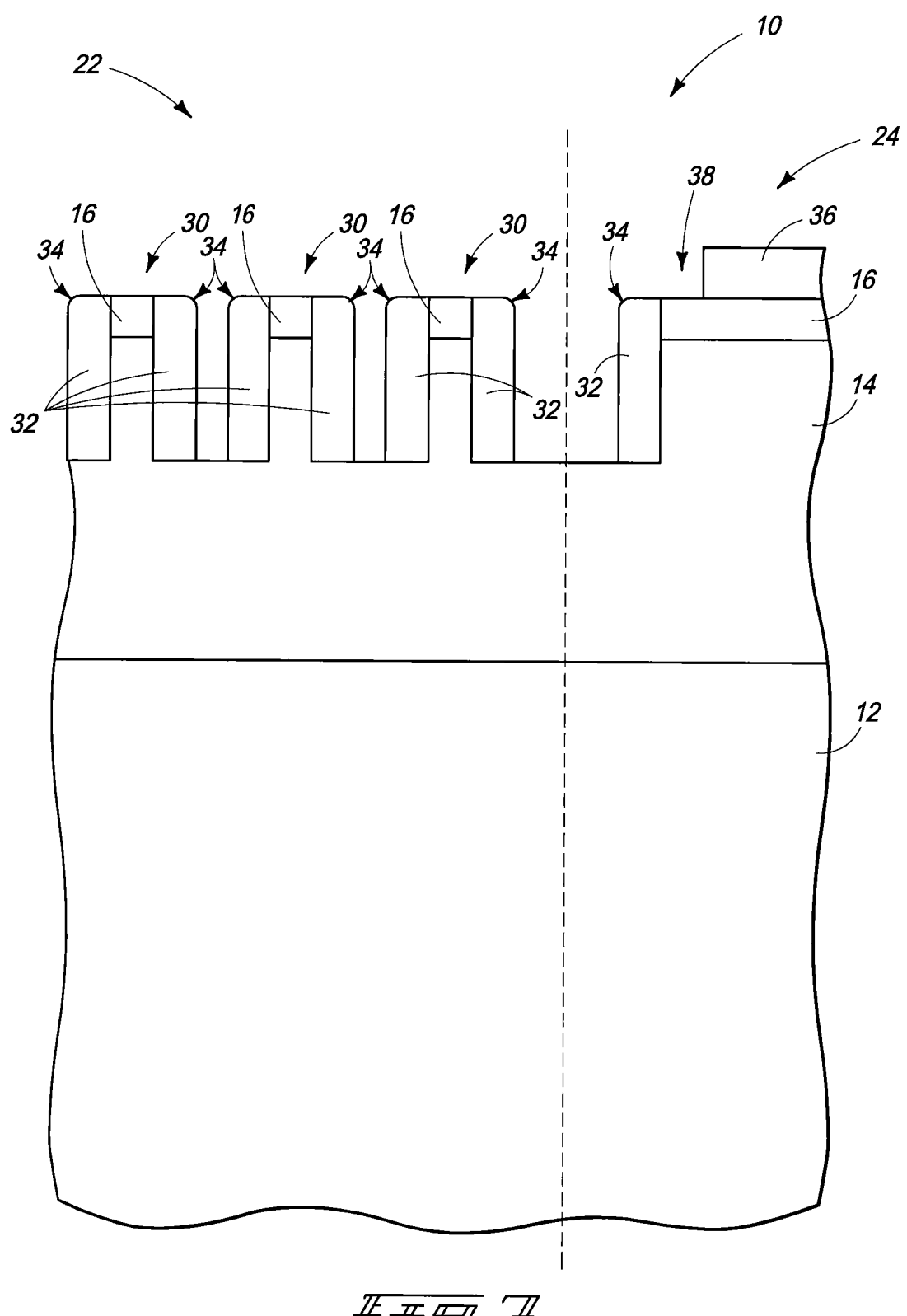
FIG. 7 is a view of the FIG. 6 substrate at a processing step subsequent to that shown by FIG. 6.

In one embodiment, a method of forming a pattern on a material additionally includes lithographically patterning the peripheral circuitry area after the partial etching into the carbon-comprising material, and in one embodiment after forming the anisotropically etched spacers. Such is shown by way of example only in FIG. 7 wherein a suitable masking material 36 has been deposited and lithographically patterned within peripheral circuitry area 24. Example masking material 36 may be homogenous or non-homogenous, and may comprise multiple different composition layers. Regardless, FIG. 7 depicts masking material 36 having been patterned to form an example feature opening 38 within peripheral circuitry area 24. Other and/or additional features (not shown) would likely also be formed in peripheral circuitry area 24.

Figure 8:
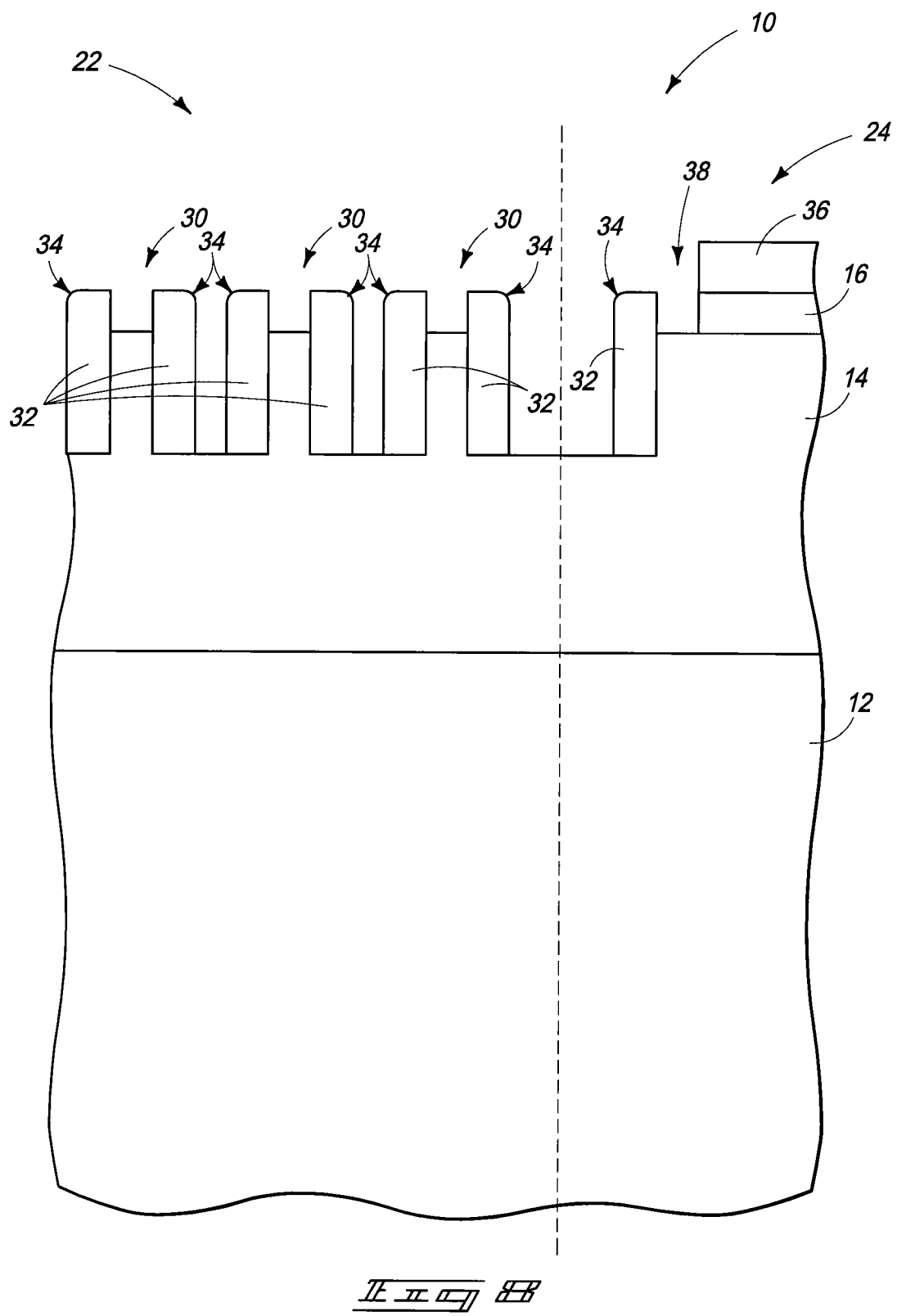
FIG. 8 is a view of the FIG. 7 substrate at a processing step subsequent to that shown by FIG. 7.

Referring to FIG. 8, second etching has been conducted of hardmask material 16 (not shown) from between anisotropically etched spacers 34. Such has also been conducted relative to example feature opening 38 in peripheral circuitry area 24. Suitable etching chemistries and conditions may be selected by the artisan for the depicted removal of the hardmasking material 16 as exemplified by FIG. 8. Such is shown as having been conducted substantially selectively relative to carbon-comprising material 14 and masking material 36, although such is not required.

Figure 9:
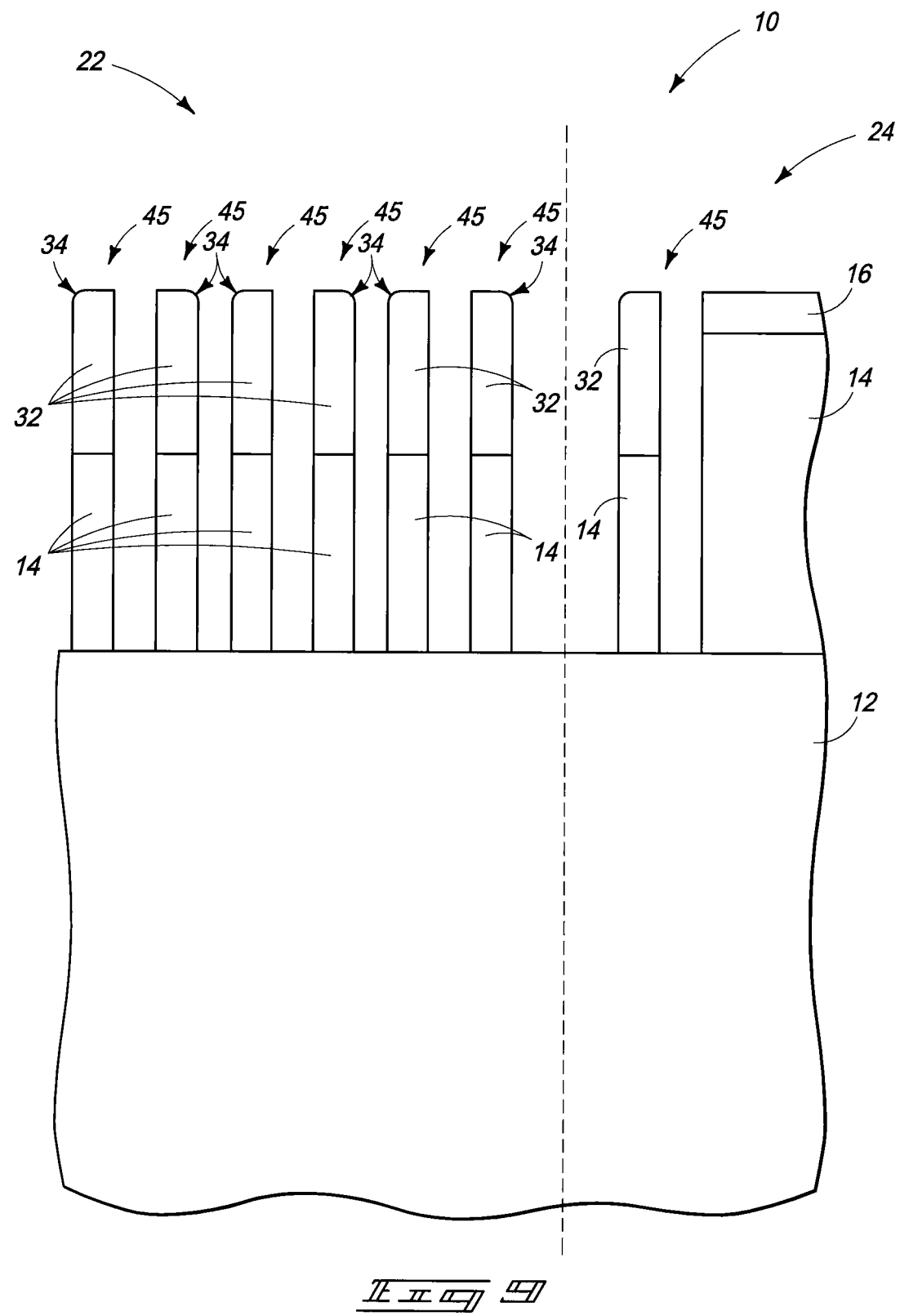
FIG. 9 is a view of the FIG. 8 substrate at a processing step subsequent to that shown by FIG. 8.

Referring to FIG. 9, third etching has been conducted through carbon-comprising material 14 to base material 12 using anisotropically etched spacers 34 as a mask. Some or none of anisotropically etched spacers 34 may be etched during such etching of carbon-comprising material 14. FIG. 9 depicts one example embodiment wherein etching of carbon-comprising material 14 has been conducted substantially selectively relative to material 32 of anisotropically etched spacers and selectively relative to hard masking material 16 in peripheral circuitry area 24. Example etching chemistry and conditions to produce the FIG. 9 construction are the same as that described above in conducting the FIG. 4 etch.

Regardless, FIG. 9 depicts formation of spaced third features 45 which comprise anisotropically etched spacers 34 and carbon-comprising material 14. FIG. 9 also depicts one example pattern formed on a substrate.

Figure 10:
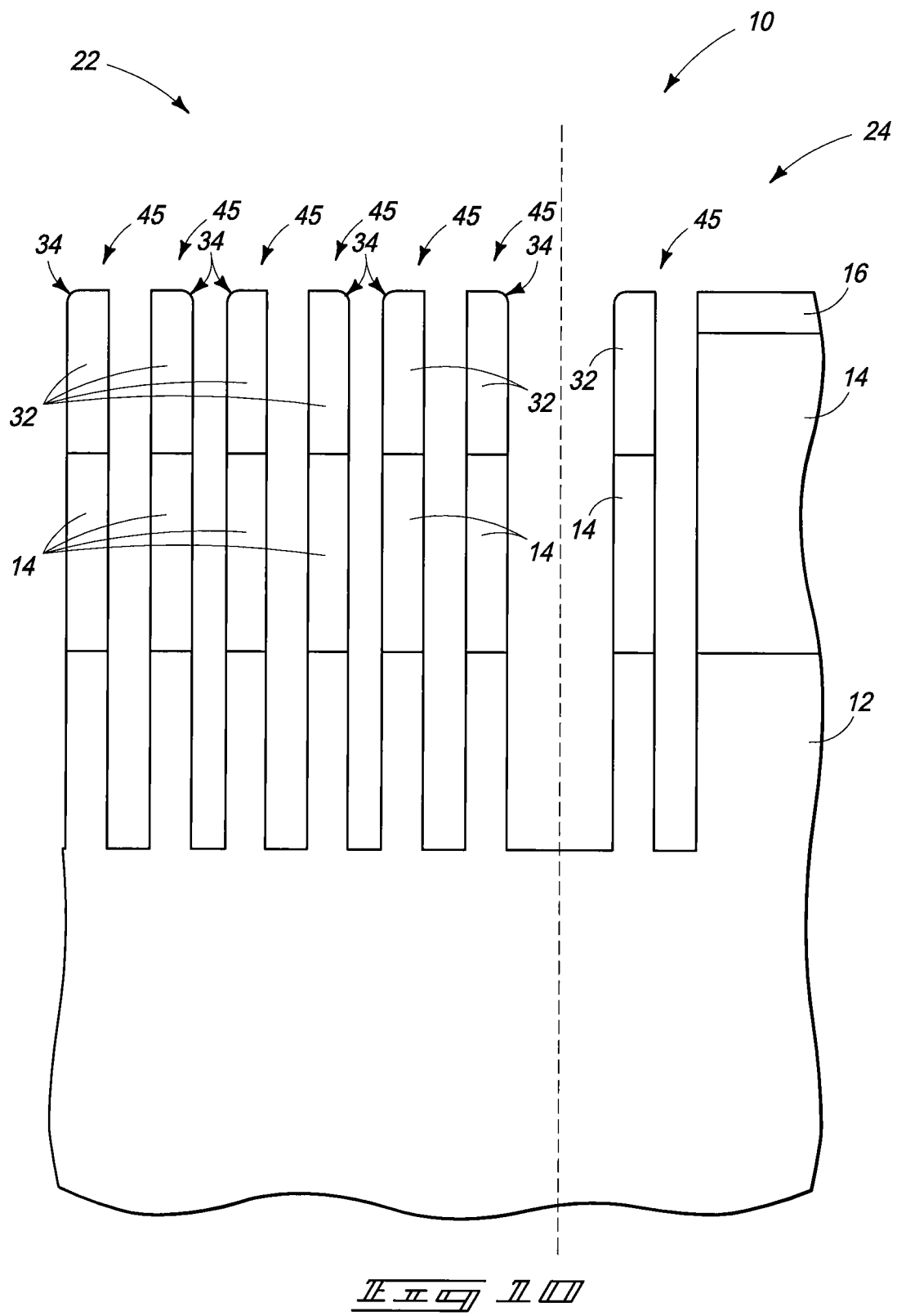
FIG. 10 is a view of the FIG. 9 substrate at a processing step subsequent to that shown by FIG. 9.
Figure 11:
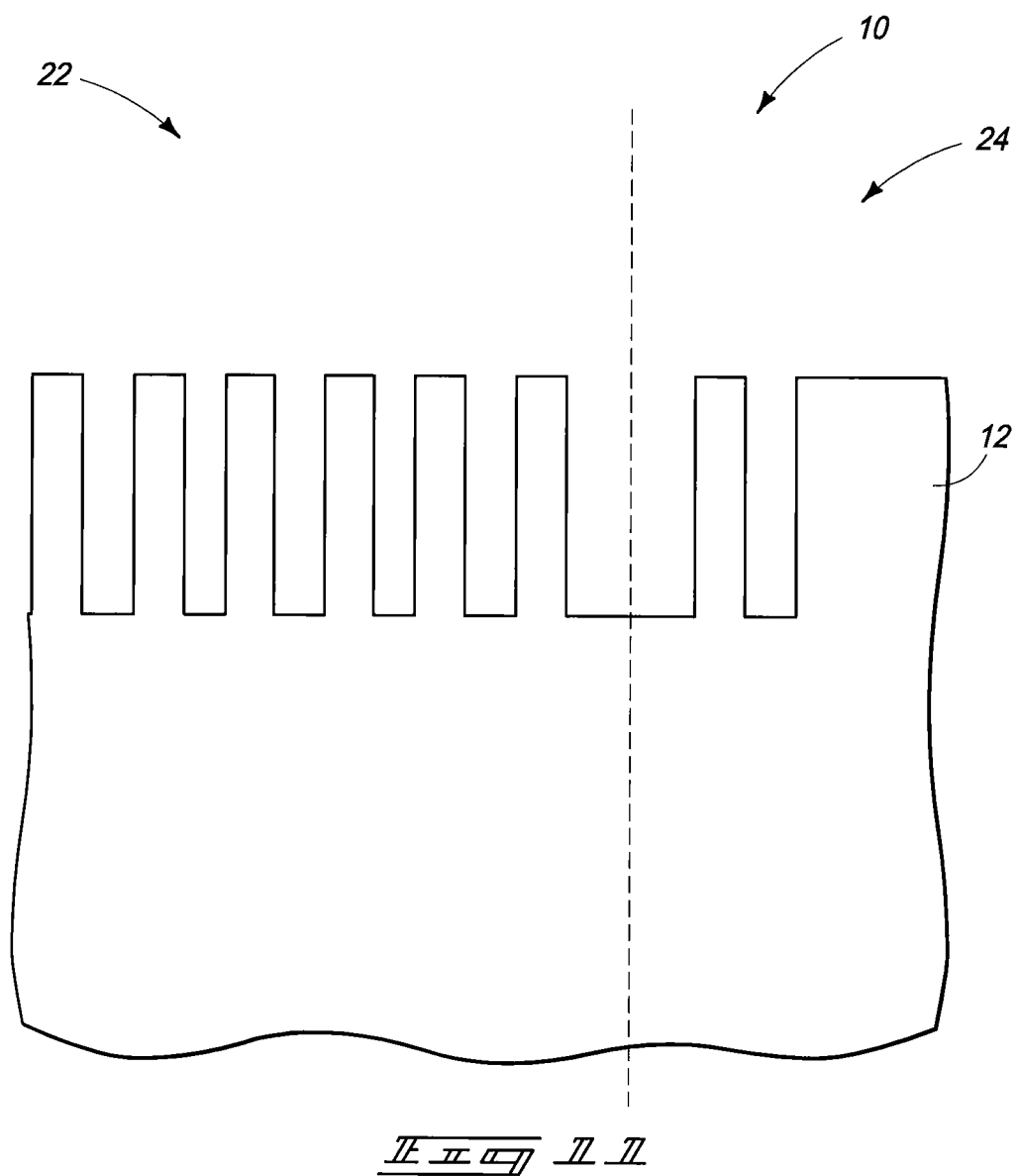
FIG. 11 is a view of the FIG. 10 substrate at a processing step subsequent to that shown by FIG. 10.

Pattern formation may continue relative to substrate 10. For example, base material 12 may be processed through a mask pattern comprising spaced third features 45. For example, base material 12 may be ion implanted or otherwise doped through mask openings defined between spaced third features 45. Additionally or alternately, such processing might comprise etching into base material 12, as shown by way of example only in FIG. 10. One or more different etching chemistries might be utilized depending upon the composition or compositions of material of base material 12 being etched. FIG. 10 depicts partial etching into base material 12, and FIG. 11 depicts subsequent removal of materials 14, 30 and 16 (not shown) from outwardly of base material 12. Some, none, or all of materials 14, 30, and 16 may be removed (i.e., etched) during the FIG. 10 etching. Regardless, FIG. 11 depicts but one example of another pattern formed on a substrate by one or more aspects of the above embodiments.

Figure 12:
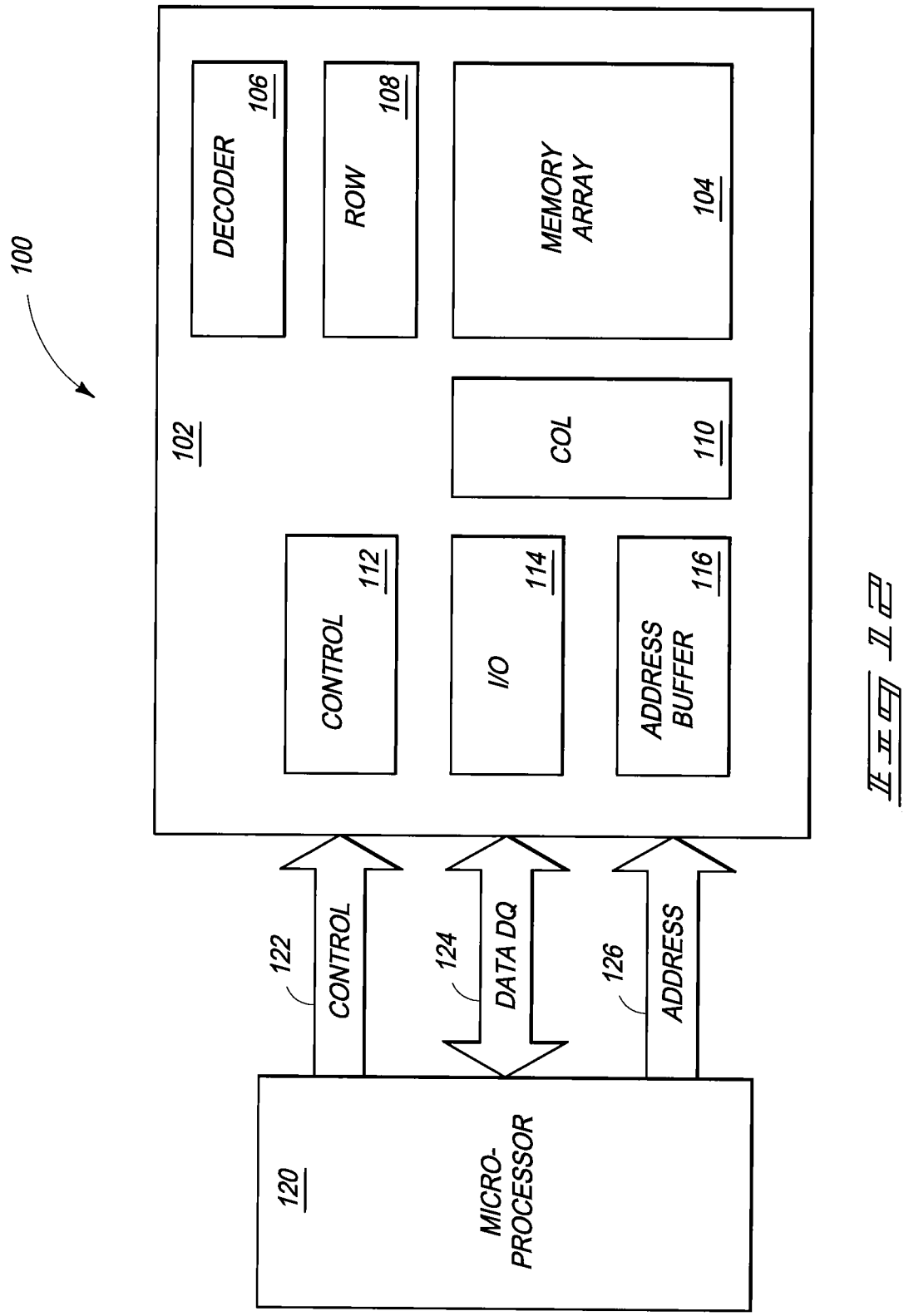
FIG. 12 is a simplified block diagram of a memory system in accordance with an embodiment.
Figure 11:
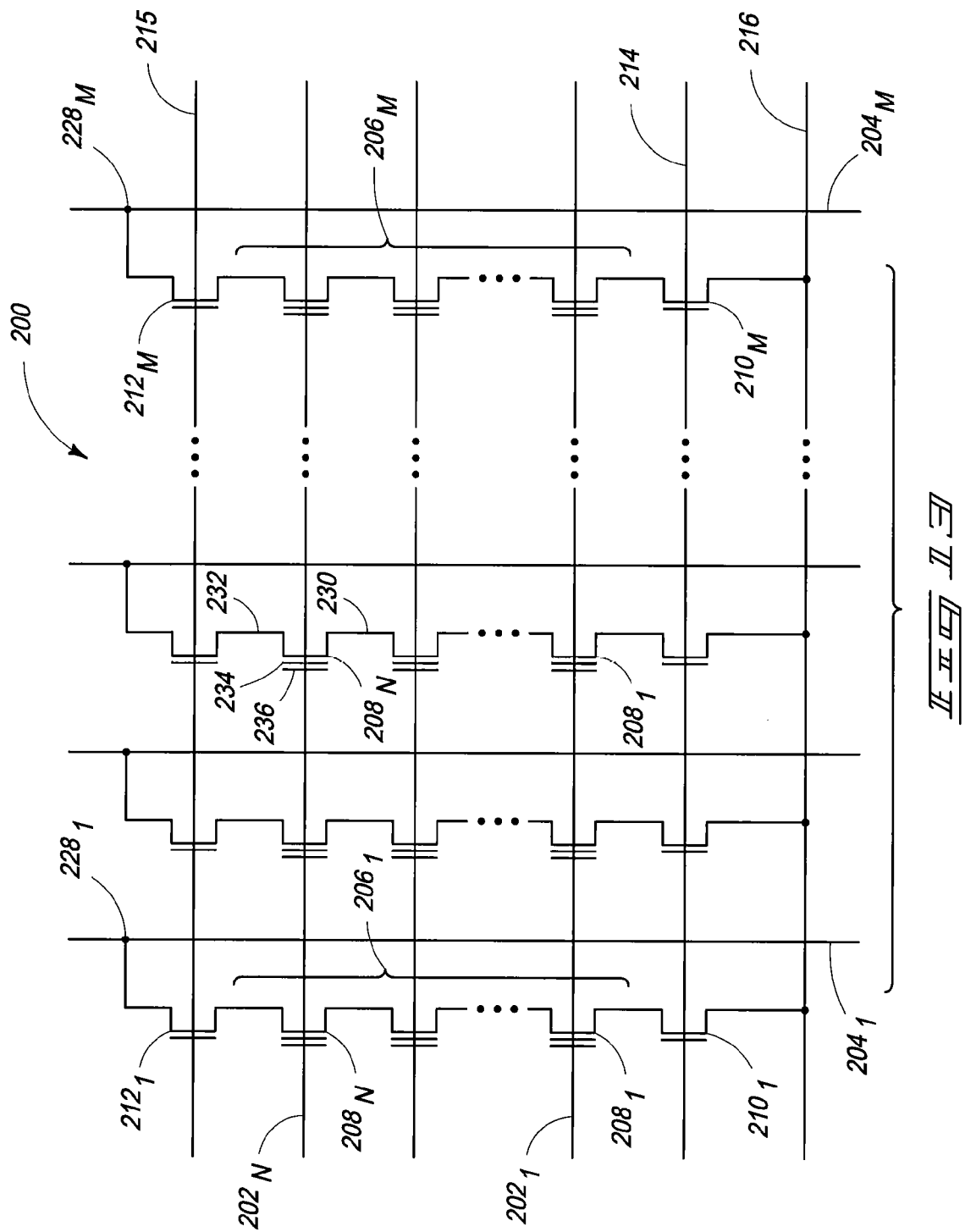

In one embodiment, base material 12 may be used to form a pattern of charge storage transistor gate constructions for use in NAND circuitry. Example NAND circuitry is described with reference to FIGS. 12 and 13. FIG. 12 is a simplified block diagram of an example memory system 100. Such includes an integrated circuit NAND flash memory device 102 that includes an array of floating-gate memory cells 104, an address decoder 106, row access circuitry 108, column access circuitry 110, control circuitry 112, input/output (I/O) circuitry 114, and an address buffer 116. Memory system 100 includes an external microprocessor 120 electrically connected to memory device 102 for memory accessing as part of an electronic system. Memory device 102 receives control signals from processor 120 over a control link 122. The memory cells are used to store data that is accessed via a data (DQ) link 124. Address signals are received via an address link 126, and are decoded at address decoder 106 to access the memory array 104. Address buffer circuit 116 latches the address signals. The memory cells may be accessed in response to the control signals and the address signals.

FIG. 13 is a schematic of a NAND memory array 200. Such may be a portion of memory array 104 of FIG. 18. Memory array 200 includes access lines (i.e., wordlines) $202_1$ to $202_N$, and intersecting local data lines (i.e., bitlines) $204_1$ to $204_M$. The number of wordlines 202 and the number of bitlines 204 may be each some power of two, for example 64 wordlines and 64 bitlines. The local bitlines 204 may be coupled to global bitlines (not shown) in a many-to-one relationship.

Memory array 200 includes NAND strings $206_1$ to $206_M$. Each NAND string includes floating gate transistors $208_1$ to $208_N$. The floating gate transistors are located at intersections of wordlines 202 and a local bitlines 204. The floating gate transistors 208 represent non-volatile memory cells for storage of data, or in other words are comprised by flash transistor gates. The floating gate transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 (i.e., flash transistors 208) include a source 230 and a drain 232, a floating gate 234, and a control gate 236. Floating gate transistors 208 have their control gates 236 coupled to a wordline 202. A column of the floating gate transistors 208 are those NAND strings 206 coupled to a given local bitline 204. A row of the floating gate transistors 208 are those transistors commonly coupled to a given wordline 202.

Floating gate transistors 208 may be considered as comprising charge storage transistor gate constructions in NAND memory circuitry. For example, base material 12 may be fabricated to comprise an appropriate stack for forming such constructions. By way of example only, FIG. 14 depicts one example stack of materials with respect to a substrate fragment 10a from which an example charge storage transistor gate construction may be fabricated in accordance with any of the above techniques. Like numerals from the above-described embodiments have been utilized where appropriate, with some construction differences being indicated with the suffix "a" or with different numerals. In FIG. 14, base material 12a is depicted as comprising a stack of different materials. For example, material 50 may be semiconductor material, such as lightly background-doped monocrystalline silicon of a first or second conductivity type. A dielectric material 52 which will function as a tunnel dielectric has been deposited over semiconductor material 50. Any existing or yet-to-be developed material is contemplated, with silicon dioxide being an example. Tunnel dielectric 52 may be homogenous or non-homogenous, for example comprising multiple different composition dielectric layers. Floating gate material 54 has been deposited over tunnel dielectric material 52. Such may be homogenous or non-homogenous, with suitably doped silicon being one example.

Gate dielectric material 66 has been deposited over floating gate material 54. Such may be homogenous or non-homogenous, with a depicted example showing such being comprised of three layers 56, 58, and 60. Example materials include one or more of silicon dioxide, hafnium oxide, aluminum oxide, zirconium oxide, hafnium aluminum oxide, hafnium silicon oxide, etc. Regardless, conductive control gate material 62 has been deposited over gate dielectric material 66. Such also may be homogenous or non-homogenous, and may include multiple different conductive compositions and layers. Examples include conductively doped semiconductive material (i.e., silicon), elemental metals, alloys of elemental metals, and conductive metal compounds. A protective sacrificial material 64 (i.e., $SiO_2$ and/or $Si_3N_4$) has been deposited over conductive control gate material 62.

The example FIG. 14 stack of a base material 12a may be etched to form a pattern of charge storage transistor gate constructions using a mask pattern comprising spaced third features as by way of example only described above in connection with FIG. 10.

The above-described processing may or may not be conducted to result in pitch reduction. Some existing pitch reduction techniques provide a low temperature-deposited spacer directly against photoresist which might be avoided in practice of embodiments of the invention. For example in one embodiment, carbon-comprising material 14 does not comprise photoresist.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
    forming a homogenous carbon-comprising material directly on a base material;
    forming a first masking material over the homogenous carbon-comprising material, the first masking material being separated from the homogenous carbon-containing material by a hardmask material;
    forming primary features in the first masking material and subsequently laterally trimming the primary features utilizing an isotropic plasma etch with an etch chemistry consisting of $O_2$, $CF_4$ and at least one member selected from the group consisting of HBr and $Cl_2$;
    utilizing the trimmed primary features to form spaced first features comprising the hardmask material over the homogenous carbon-comprising material;
    only partially etching into the homogenous carbon-comprising material and forming spaced second features within the homogenous carbon-comprising material which comprise the partially etched homogenous carbon-comprising material and overlying hardmask material;
    forming spacers along sidewalls of the spaced second features; and
    etching through the hardmask material of the second features and subsequently etching the homogenous carbon-comprising material to the base material using the spacers as a mask and forming spaced third features comprising the spacers and the homogenous carbon-comprising material.

2. The method of claim 1 wherein forming the spacers comprises depositing of a spacer-forming layer followed by anisotropic etching of the spacer-forming layer.

3. The method of claim 1 comprising processing the base material through a mask pattern comprising the spaced third features.

4. The method of claim 3 wherein the processing comprises etching into the base material.

5. The method of claim 1 wherein the spaced first features are not in direct physical touching contact with the homogenous carbon-comprising material.

6. The method of claim 1 wherein,
    the base material comprises a stack comprising a tunnel dielectric material, floating gate material over the tunnel dielectric material, gate dielectric material over the floating gate material, and conductive control gate material over the gate dielectric material; and
    etching into the stack to form a pattern of charge storage transistor gate constructions using a mask pattern comprising the spaced third features.

7. The method of claim 1 wherein the homogenous carbon-comprising material comprises amorphous carbon.

8. The method of claim 7 wherein the homogenous carbon-comprising material consists essentially of amorphous carbon.

9. The method of claim 1 wherein the homogenous carbon-comprising material comprises transparent carbon.

10. The method of claim 9 wherein the homogenous carbon-comprising material consists essentially of transparent carbon.

11. The method of claim 1 wherein the homogenous carbon-comprising material comprises is polymeric.

12. The method of claim 11 wherein the homogenous carbon-comprising material consists essentially of polymeric material.

13. The method of claim 1 wherein the homogenous carbon-comprising material consists essentially of at least two of amorphous carbon, transparent carbon, and polymeric material.

14. The method of claim 13 wherein the homogenous carbon-comprising material consists essentially of amorphous carbon, transparent carbon, and polymeric material.

15. A method of forming a pattern on a substrate, comprising:
    forming a carbon-comprising material on a base material, and a hardmask material over the carbon-comprising material;
    forming a first masking material over the hardmask material;
    forming spaced first features in the first masking material and subsequently laterally trimming the first features utilizing an isotropic plasma etch with an etch chemistry consisting of $O_2$, $CF_4$ and at least one member selected from the group consisting of HBr and $Cl_2$, to form trimmed spaced first features over the hardmask material;
    etching through the hardmask material using the spaced first features as a mask followed by etching only partially into the carbon-comprising material and forming spaced second features within the carbon-comprising material which comprise the hardmask material and the underlying partially etched carbon-comprising material;
    forming spacers along sidewalls of the spaced second features, the spacers being along sidewalls of the hardmask material and sidewalls of the carbon-comprising material;
    after forming the spacers, etching to remove the hardmask material from between the spacers to leave the spacers projecting elevationally outward relative to an elevationally outermost part of the carbon-comprising material; and
    after etching the hardmask material, etching through the carbon-comprising material to the base material using the spacers as a mask and forming spaced third features comprising the spacers and the carbon-comprising material.

16. The method of claim 15 wherein the spaced first features are formed by forming spaced primary features followed by laterally trimming width of the spaced primary features prior to the etching through the hardmask material.

17. The method of claim 15 wherein the spaced first features comprise photoresist.

18. The method of claim 17 wherein the spaced first features are formed by depositing and patterning photoresist to form spaced primary features followed by laterally trimming width of the photoresist of the spaced primary features prior to the etching through the hardmask material.

19. The method of claim 15 wherein the carbon-comprising material comprises at least one of amorphous carbon and transparent carbon.

20. The method of claim 15 wherein the carbon-comprising material comprises a polymer.

21. The method of claim 20 wherein the carbon-comprising material consists essentially of a polymer.

22. The method of claim 15 wherein the spaced first features and the carbon-comprising material are of different compositions.

23. The method of claim 15 wherein the carbon-comprising material has a thickness from about 700 Angstroms to about 2,000 Angstroms.

24. The method of claim 15 wherein the etching only partially into the carbon-comprising material is into less than one half of thickness of the carbon-comprising material.

25. The method of claim 15 wherein the etching only partially into the carbon-comprising material is into more than one half of thickness of the carbon-comprising material.

26. The method of claim 15 wherein the hardmask material comprises an antireflective coating.

27. The method of claim 15 wherein the hardmask material is inorganic.

28. The method of claim 15 comprising removing the spaced first features from over the base material prior to forming the spacers.

29. The method of claim 28 wherein the removing is completed during the etching only partially into the carbon-comprising material.

30. The method of claim 15 wherein the spacers comprise silicon.

31. The method of claim 15 wherein the forming of the spacers leaves alternating outwardly exposed regions of the carbon-comprising material and the hardmask material between immediately adjacent ones of the spacers.

32. The method of claim 15 comprising forming the spacers in physical touching contact with carbon of the carbon-comprising material.

33. The method of claim 15 comprising fabrication of integrated circuitry comprising an array circuitry area and a peripheral circuitry area, the spaced first features being at least in the array circuitry area, and further comprising lithographically patterning the peripheral circuitry area after the partial etching into the carbon-comprising material and before the etching through the carbon material.

34. The method of claim 33 wherein the lithographically patterning is conducted after forming the spacers.

35. The method of claim 15 wherein the carbon-comprising material is homogenous.

36. A method of forming a pattern on a substrate, comprising:
    forming a carbon-comprising material directly on a semiconductive base material, a hardmask material over the carbon-comprising material, and spaced first features in a first masking material over the hardmask material;
    laterally trimming the spaced first features utilizing an isotropic plasma etch with an etch chemistry consisting of $O_2$, $CF_4$ and at least one member selected from the group consisting of HBr and $Cl_2$, to formed narrowed spaced first features;
    etching through the hardmask material using the narrowed spaced first features as a mask followed by etching only partially into the underlying carbon-comprising material and forming spaced second features within the carbon-comprising material which comprise the hardmask material and the partially etched carbon-comprising material;
    forming spacers along sidewalls of the spaced second features, the spacers being along the hardmask material and the carbon-comprising material;
    after forming the spacers, etching the hardmask material from between the spacers; and
    etching through the carbon-comprising material to the base material using the spacers as a mask and forming spaced third features comprising the spacers and the carbon-comprising material, the carbon-comprising material consists essentially of at least one of amorphous carbon and transparent carbon.

37. A method of forming a pattern on a substrate, comprising:
    forming a carbon-comprising material directly on a semiconductive base material, an antireflective hardmask material over the carbon-comprising material, and spaced photoresist-comprising features over the hardmask material;
    laterally trimming width of the photoresist-comprising features to form spaced photoresist-comprising first features over the antireflective hardmask material; the lateral trimming utilizing an isotropic plasma etch with an etch chemistry consisting of $O_2$, $CF_4$ and at least one member selected from the group consisting of HBr and $Cl_2$;
    etching through the antireflective hardmask material using the spaced photoresist-comprising first features as a mask and at least some of which remain after the etching through the antireflective hardmask material;
    after the etching through the antireflective hardmask material, etching only partially into the carbon-comprising material and forming spaced second features within the carbon-comprising material which comprise the antireflective hardmask material and the underlying partially etched carbon-comprising material, the partial etching into the carbon-comprising material etching all remnant of the spaced photoresist-comprising first features from being received over the base material prior to completion of said partial etching into the carbon-comprising material;
    forming anisotropically etched spacers along sidewalls of the spaced second features to leave alternating outwardly exposed regions of the carbon-comprising material and the antireflective hardmask material between immediately adjacent of the anisotropically etched spacers;
    after forming the spacers, etching the antireflective hardmask material from between the anisotropically etched spacers to leave the spacers projecting elevationally outward relative to an elevationally outermost part of the underlying carbon-comprising material; and
    etching through the carbon-comprising material to the base material using the anisotropically etched spacers as a mask and forming spaced third features comprising the anisotropically etched spacers and the carbon-comprising material.

38. The method of claim 37 wherein the carbon-comprising material is homogenous.

39. A method of forming a pattern on a substrate, comprising:
    forming a material consisting essentially of carbon directly on a semiconductive base material, and spaced first features over the material consisting essentially of carbon;
    laterally trimming the spaced first features utilizing an isotropic plasma etch with an etch chemistry consisting of $O_2$, $CF_4$ and at least one member selected from the group consisting of HBr and $Cl_2$;

only partially etching into the material consisting essentially of carbon and forming spaced second features within the material consisting essentially of carbon which comprise the partially etched material consisting essentially of carbon;

forming spacers along sidewalls of the spaced second features, the spacers being along hardmask material and material consisting essentially of carbon; and after forming the spacers, etching through the material consisting essentially of carbon to the base material using the spacers as a mask and forming spaced third features comprising the spacers and the material consisting essentially of carbon.

40. The method of claim 39 wherein the material consisting essentially of carbon consists essentially of at least two of amorphous carbon, transparent carbon, and polymeric material.

41. The method of claim 40 wherein the material consisting essentially of carbon consists essentially of amorphous carbon, transparent carbon, and polymeric material.

42. A method of forming a pattern on a substrate, comprising:

forming a material consisting essentially of carbon directly on a semiconductive base material, a hardmask material over the material consisting essentially of carbon, and spaced first features over the hardmask material;

laterally trimming the spaced first features utilizing an isotropic plasma etch with an etch chemistry consisting of $O_2$, $CF_4$ and at least one member selected from the group consisting of HBr and $Cl_2$;

etching through the hardmask material using the spaced first features as a mask followed by etching only partially into the material consisting essentially of carbon and forming spaced second features within the material consisting essentially of carbon which comprise the hardmask material over the partially etched material consisting essentially of carbon;

forming spacers along sidewalls of the spaced second features, the spacers being along hardmask material and material consisting essentially of carbon;

etching the hardmask material from between the spacers; and etching through the material consisting essentially of carbon to the base material using the spacers as a mask and forming spaced third features comprising the spacers and the material consisting essentially of carbon.

43. The method of claim 42 wherein the material consisting essentially of carbon consists essentially of at least two of amorphous carbon, transparent carbon, and polymeric material.

44. The method of claim 43 wherein the material consisting essentially of carbon consists essentially of amorphous carbon, transparent carbon, and polymeric material.

45. A method of forming a pattern on a substrate, comprising:

forming a material consisting essentially of carbon directly on a semiconductive base material, an antireflective hardmask material over the material consisting essentially of carbon, and spaced photoresist-comprising features over the hardmask material;

laterally trimming width of the photoresist-comprising features utilizing an isotropic plasma etch with an etch chemistry consisting of $O_2$, $CF_4$ and at least one member selected from the group consisting of HBr and $Cl_2$, to form narrowed spaced photoresist-comprising first features over the antireflective hardmask material;

etching through the antireflective hardmask material using the spaced photoresist-comprising first features as a mask and at least some of which remain after the etching through the antireflective hardmask material;

after the etching through the antireflective hardmask material, etching only partially into the underlying material consisting essentially of carbon and forming spaced second features within the material consisting essentially of carbon which comprise the antireflective hardmask material and the partially etched material consisting essentially of carbon, the partial etching into the material consisting essentially of carbon etching all remnant of the spaced photoresist-comprising first features from being received over the base material prior to completion of said partial etching into the material consisting essentially of carbon;

forming anisotropically etched spacers along sidewalls of the spaced second features to leave alternating outwardly exposed regions of the material consisting essentially of carbon and the antireflective hardmask material between immediately adjacent of the anisotropically etched spacers;

after forming the spacers, etching the antireflective hardmask material from between the anisotropically etched spacers; and etching through the material consisting essentially of carbon to the base material using the anisotropically etched spacers as a mask and forming spaced third features comprising the anisotropically etched spacers and the material consisting essentially of carbon.

46. The method of claim 45 wherein the material consisting essentially of carbon consists essentially of at least two of amorphous carbon, transparent carbon, and polymeric material.

47. The method of claim 46 wherein the material consisting essentially of carbon consists essentially of amorphous carbon, transparent carbon, and polymeric material.

* * * * *